(12) United States Patent
Mahmoud (10) Patent No.: US 7,127,002 B1
(45) Date of Patent: Oct. 24, 2006

(54) SYSTEM AND METHOD FOR FREQUENCY AND PHASE MODULATING DATA ON A SCSI BUS OR A SERIAL SCSI LINK

(75) Inventor: Fadi A. Mahmoud, Livermore, CA (US)

(73) Assignee: Adaptec, Inc., Milpitas, CA (US)

( * ) Notice: Subject to any disclaimer, the term of this patent is extended or adjusted under 35 U.S.C. 154(b) by 820 days.

(21) Appl. No.: 10/226,587

(22) Filed: Aug. 23, 2002

(51) Int. Cl.
*H03K 7/06* (2006.01)
*H04L 7/00* (2006.01)
*H03D 3/24* (2006.01)

(52) U.S. Cl. .................. 375/271; 375/371; 375/376
(58) Field of Classification Search ................ 375/271, 375/371, 376
See application file for complete search history.

(56) References Cited

OTHER PUBLICATIONS

U.S. Appl. No. 10/215,069, filed Aug. 7, 2002, entitled "Method for Optimizing Data Transfer Rates Through Multilevel Coding".

*Primary Examiner*—Khai Tran
*Assistant Examiner*—Cicely Ware
(74) *Attorney, Agent, or Firm*—Martine Penilla & Gencarella, LLP (57) ABSTRACT

A system and a method for multiplying data throughput in a SCSI bus includes identifying multiple frequencies within a bandwidth of a SCSI bus. A binary value is assigned to each one of the multiple frequencies. One of the multiple frequencies is selected. The assigned binary value of the selected frequency corresponds to a set of bits to be transmitted during a first sampling cycle. The selected frequency is transmitted on the SCSI bus during the first sampling cycle.

13 Claims, 10 Drawing Sheets

SYSTEM AND METHOD FOR FREQUENCY AND PHASE MODULATING DATA ON A SCSI BUS OR A SERIAL SCSI LINK

CROSS REFERENCE TO RELATED APPLICATIONS

This application is related to U.S. patent application Ser. No. 10/215,069 filed on Aug. 7, 2002 and entitled "Method For Optimizing Data Transfer Rates Through Multilevel Coding," which is incorporated herein by reference in its entirety.

BACKGROUND OF THE INVENTION

1. Field of the Invention

The present invention relates generally to computer bus systems, and more particularly, to methods and systems for increasing the data throughput of SCSI bus systems by frequency and/or phase modulating the data transmitted via the bus.

2. Description of the Related Art

A typical computer system may include a computer and peripheral devices such as, for example, storage devices that are interconnected by data buses. For the computer to transfer data to and from the storage device, an input and output connected by differential drivers may be utilized. Within a computer system, it is often desirable to connect a variety of peripherals to the system bus of the computer itself for communication with the central processing unit and other devices connected to the computer. A variety of bus types may be used for this purpose.

To access and control certain types of peripheral devices connected to a computer system, the computer generally utilizes host adapter cards (or controllers) attached to the computer's internal bus. The computer may also have peripheral device controllers built into the motherboard. These device controllers coordinate and manage the data communication to and from the peripheral devices through the various computer busses included in the computer. Device controllers can include a video display adapter, an integrated drive electronics (IDE) controller, a small computer system interface (SCSI) controller, or other similar cards or chips, which control peripheral devices.

Device controllers can communicate with the peripheral devices through one or more busses connecting the computer with the peripheral devices. For example, by use of software device drivers, a host computer can instruct a SCSI chip within the SCSI controller to manage a specific peripheral device and control the data transfer between the peripheral device and the host computer. Therefore, it is important to have optimum throughput through a bus so controllers and peripheral devices may communicate with each other in an optimum manner.

Figure 1A:
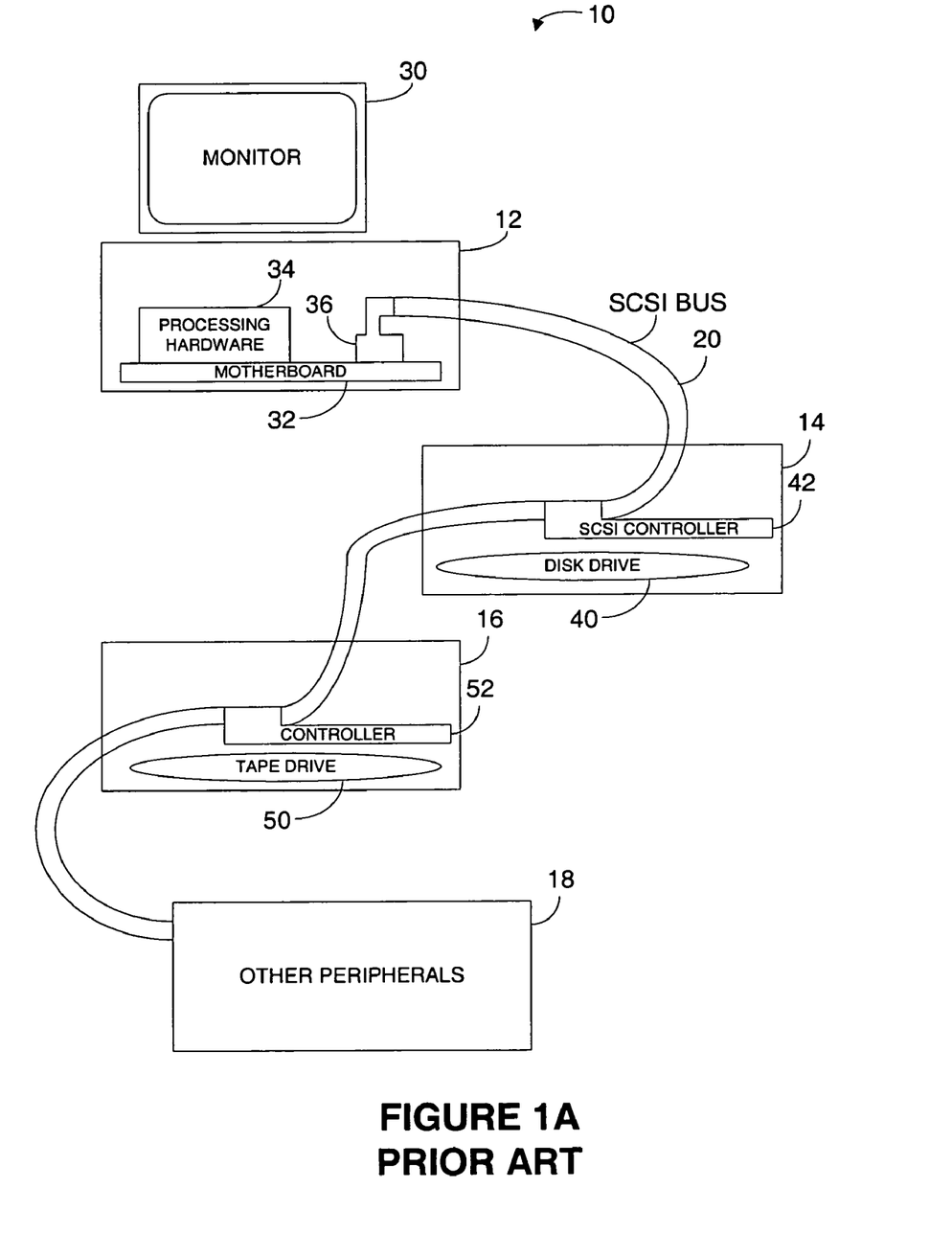
FIG. 1A illustrates an example of a computer system.

FIG. 1A illustrates an example of a computer system 10. The computer system 10 includes a computer 12, a disk drive 14, a tape drive 16, and any number of other peripherals 18 such as card reader units, voice input/output, displays, video input/output, scanners, etc. The computer and peripherals in this example are connected via a SCSI bus 20, although a wide variety of other types of buses may also be used.

Any number of computers or hosts may be present in computer system 10 and be connected to SCSI bus 20. Each computer may also contain a variety of hardware and software. By way of example, computer 12 includes a monitor 30, a motherboard 32, a wide variety of processing hardware and software 34 and a SCSI host adapter card (or interface card) 36. Host adapter card 36 provides an interface between the microcomputer bus of computer 12, located on motherboard 32, and SCSI bus 20.

SCSI is a universal interface standard for connecting disks and other high performance peripherals to microcomputers. There are both parallel SCSI and serial SCSI interfaces. While exemplary parallel SCSI interfaces are discussed herein, the concepts and principles taught can also generally be applied to series SCSI interfaces. However, it should be appreciated that computer system 10 is an exemplary system, and other interface standards having characteristics similar to SCSI may also be used in such a computer system.

In one example, SCSI bus 20 is an 8-bit parallel flat cable interface (18 total signals) with handshakes and protocols for handling multiple hosts and multiple peripherals. The parallel flat cable interface has both a synchronous and an asynchronous mode, and has defined software protocols. In the embodiment shown, the SCSI bus uses differential drivers, although SCSI is also available with single wire drivers. SCSI interface cards (such as card 36) plug into most microcomputer buses including VME, Multibus I and II, PCI, ISA, VL, EISA and MCA. In another embodiment, SCSI bus 20 is a 16-bit parallel cable interface (27 total signals). In other embodiments motherboard 32 has SCSI adapter card 36 incorporated into the motherboard itself, and a separate, plug-in adapter card is not needed. SCSI bus 20 is a multi-drop bus typically produced as a flat cable that connects from a computer 12 to any number of peripherals. In this example, disk drive 14, tape drive 16, and other peripherals 18 connect to SCSI bus 20 by tapping into the bus. In other examples, it is also possible for any number of peripherals to be included within computer 12 in which case SCSI bus 20 may also be present inside computer 12.

Disk drive 14 includes the physical disk drive unit 40 and SCSI controller card 42 and other internal cables and device level interfaces (not shown) for enabling the unit to communicate with computer 12. After connecting to disk drive 14, SCSI bus 20 continues on to connect to tape drive 16. Tape drive 16 includes the physical tape drive 50, SCSI controller card 52, and other internal cables and interfaces (not shown) for communicating with computer 12.

In a typical SCSI data transmission system, a transmitter is connected to a receiver by transmission lines. When data is transferred from the transmitter to the receiver, which may happen, for example, when the SCSI controller card 52 transmits data to the disk drive 14, data can be sent where one bit is sent in a clock cycle at given frequency. If a data transmission is double clocked, one bit may be sent per half cycle so that two bits of data may be sent during one full clock cycle. Therefore, at maximum, prior art systems are generally not capable of sending more than 2 bits per full clock cycle. Consequently, at a frequency of, for example 80 MHz, 160 Mbits of data per second may be sent. This severely limits the amount of data throughput that may be transmitted through a bus such as, for example, the SCSI bus 20.

Figure 1B:
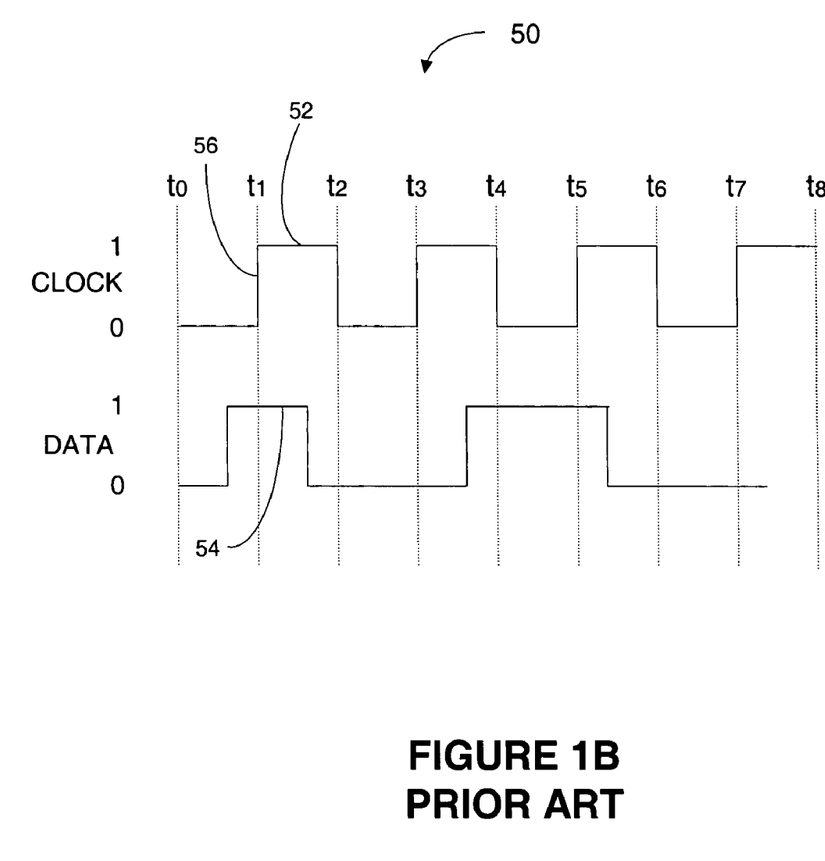
FIG. 1B shows a diagram illustrating a time progression in relation to data transmission in a typical data transmission bus.

FIG. 1B shows a diagram 50 illustrating a time progression in relation to data transmission in a typical data transmission bus. Double transition clocking, (also referred to as dual edge clocking or double clocking as used herein) can be utilized in data transmission so both the leading edge and the trailing edge of the clocking signal are used to clock a data line sampling. In this example, data sent through a bus is double clocked so two voltage signal levels corresponding to a bit content of "0" and "1" respectively are utilized to transmit data from the transmitter to the receiver. As is well known by one skilled in the art, digital data is transmitted using a single bit "0" or a single bit "1". In this environment, a signal level voltage of 0 volts corresponds to the bit content of "0" and a signal voltage of 5 volts corresponds to the bit content of "1". A clock signal 52 is coordinated with digital signal 54 so each of the clock edges initiates a signal level output as shown by data initiation 56 at time t1.

Unfortunately, after a certain frequency is reached, data transmission through a bus is limited due to numerous constraints. For example, a particular bus has a certain max bandwidth with a cut off frequency. Typically, the clock cutoff frequency is 40 MHz, and any frequency beyond 40 MHz is very difficult to utilize. Therefore, even with double clocking, it is very difficult to achieve greater than a raw data transfer rate of 80 Mbytes per second (40 Mbytes per second×2 for double clocking) in SCSI systems. Unfortunately, when the cutoff frequency is reached, the signal becomes so degraded due to increased noise levels that it is extremely difficult if not impossible to tell if the digital signal is transmitting a "0" or a "1". Consequently, after the certain frequency is reached, data throughput speed is limited and data transmission speeds can be a bottleneck in data processing operations.

In view of the foregoing, what is needed is a new and improved methodology for optimizing data transmission methods by enhancing digital data throughput through a SCSI bus. Such an approach would thereby ensure proper initialization of the computer system.

SUMMARY OF THE INVENTION

Broadly speaking, the present invention fills these needs by providing a system and a method for multiplying data throughput in a SCSI bus by frequency shift keying (FSK) and/or phase shift keying (PSK). It should be appreciated that the present invention can be implemented in numerous ways, including as a process, an apparatus, a system, computer readable media, or a device. Several inventive embodiments of the present invention are described below.

A system and a method for multiplying data throughput in a SCSI bus includes identifying multiple frequencies within a bandwidth of a SCSI bus. A binary value is assigned to each one of the multiple frequencies. One of the multiple frequencies is selected. The assigned binary value of the selected frequency corresponds to a set of bits to be transmitted during a first sampling cycle. The selected frequency is transmitted on the SCSI bus during the first sampling cycle.

In one embodiment the system and method can also include receiving the selected frequency in a receiver during the first sampling cycle. The selected frequency is identified and the corresponding assigned binary value of the selected frequency is determined. The corresponding assigned binary value of the selected frequency can be output.

The multiple of frequencies can include $2^n$ frequencies, where n is equal to the number of bits in the binary value assigned to each of the frequencies. The frequencies can be substantially centered about a base frequency. The frequencies can also be substantially equidistant. The base frequency can be centered in the bandwidth of the SCSI bus.

The SCSI bus can include a parallel or a serial SCSI bus.

The system and method can also include multiplying data by using multilevel data encoding and/or +/−data and/or double edge clocking the data.

One embodiment is a system for multiplying data throughput in a SCSI bus and includes a transmitter, and a receiver. The transmitter can include a data input, a modulator and a first phase locked loop (PLL) circuit. The first PLL circuit can be for stabilizing a clock signal. The stabilized clock signal can be coupled to the modulator. The receiver can be coupled to the transmitter by a SCSI bus. The receiver can include a demodulator, an adding circuit having a first input coupled to an output of the demodulator, and a second PLL circuit. The second PLL circuit can have an input coupled to the stabilized clock signal from the first PLL circuit. The second PLL circuit can also have an output coupled to a second input to the adding circuit.

Another embodiment is a system and method for multiplying data throughput in a SCSI bus including identifying a multiple of phases of a selected frequency within a bandwidth of a SCSI bus. A binary value is assigned to each of the phases. A selected one of the phases is transmitted, on the SCSI bus during a first sampling cycle. The assigned binary value of the selected phase corresponds to a set of bits to be transmitted during the first sampling cycle.

The selected frequency is centered in the bandwidth of the SCSI bus.

The system and method can also include receiving the selected phase in a receiver during the first sampling cycle. The selected phase is identified. The corresponding assigned binary value of the selected phase is determined and can be output.

The phases can include $2^n$ phases where n is equal to the number of phases in the binary value assigned to each of the phases. The phases can be substantially centered about a base reference signal. The phases can also be substantially equidistant. The substantially equidistant phases can include four, eight, sixteen or more substantially equidistant phases.

Another embodiment includes a system for multiplying data throughput in a SCSI bus including a transmitter and a receiver that are coupled by a SCSI bus. The transmitter can include a data input and a first PLL circuit for shifting the phase of a base reference signal according to an input signal applied to the data input. The transmitter can also include a second PLL circuit for stabilizing a clock signal. The receiver can include a third PLL circuit. The third PLL circuit can compare a base reference signal to the phase shifted data signal output from the transmitter. The third PLL circuit has an output. The receiver also includes an adding circuit that has a first input coupled to an output of the third PLL circuit. The receiver also includes a fourth PLL circuit that has an input coupled to the stabilized clock signal from the second PLL circuit and an output coupled to a second input to the adding circuit.

One advantage provided by the present invention is that it substantially increases the data throughput by FSK encoding multiple data bits on each sampling cycle thereby effectively multiplying the data throughput by a factor of the number of bits being encoded on each sampling cycle.

Another advantage provided by the present invention is that it substantially increases the data throughput by PSK encoding multiple data bits on each sampling cycle thereby effectively multiplying the data throughput by a factor of the number of bits being encoded on each sampling cycle. PSK can also be more stable than FSK and can therefore be more expandable than FSK.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION OF THE EXEMPLARY EMBODIMENTS

Several exemplary embodiments for systems and methods of frequency and phase modulating data on a SCSI bus will now be described. It will be apparent to those skilled in the art that the present invention may be practiced without some or all of the specific details set forth herein.

Systems and methods to increase data throughput are a constant goal especially between a computer's central processing unit (CPU) and the various peripheral devices that the CPU must access. One limitation of the speed at which a computer can process data is the limited speed at which the CPU can access data to be processed (e.g., stored data) and the limited speed at which the CPU can output resulting processed data (e.g., to store the data or to output the data via a display, printer, or other output device). The SCSI bus can be used to link the CPU and the various peripherals.

One embodiment of the present invention provides a system and method for multiplying the number of bits that are sent on each clock. As will be described in more detail below, the multiplication scheme can be a two bit, three bit, four bit or more data bits multiplication scheme. By way of example, a two bit data multiplication scheme sends two bits of data on each sampling cycle such as on each clock cycle or on each half clock cycle when combined with a double clocking scheme. Similarly, a three-bit data multiplication scheme sends three bits of data on each sampling cycle and a four-bit data multiplication scheme sends four bits of data on each sampling cycle.

One embodiment encodes and decodes multiple data bits on each sampling cycle by using frequency shift keying (FSK). FSK is where a selected frequency (F) is shifted either up or down in frequency to indicate data. By way of example, if the selected base frequency $F_b$ is 30 MHz, then shifting $F_b$ to 30.025 MHz (i.e., a plus 25 kHz shift) could indicate a logical "1". Similarly, shifting $F_b$ to 29.975 MHz (i.e., a minus 25 kHz shift) could indicate a logical "0". Each frequency shift (or $\Delta F$) of 25 kHz is used to indicate different conditions of a single data bit.

Extending the basic FSK scheme described above, if multiple $\Delta F$s are used, then multiple data bits can be encoded. In one instance, if four different $\Delta F$s are used ($F_0$, $F_1$, $F_2$, $F_3$), then four separate conditions can be communicated. Each condition can represent one of the four states of two bits of data similar to a two bit counter that has four possible states: 00, 01, 10, 11. The following Table 1 shows a logic table of the relationship of the four conditions, the four states, the respective frequencies and the respective number of frequency shifts (i.e., $\Delta$).

TABLE 1

| Condition | State/data | Frequency Shift | #$\Delta F$ = 25 kHz | CLK | non-FSK data |
|---|---|---|---|---|---|
| $F_0$ | 00 | 30.025 MHz | +1 $\Delta F$ | 1 | 1 or 0 |
| $F_1$ | 01 | 30.050 MHz | +2 $\Delta F$ | 1 | 1 or 0 |
| $F_2$ | 10 | 30.075 MHz | +3 $\Delta F$ | 1 | 1 or 0 |
| $F_3$ | 00 | 30.100 MHz | +4 $\Delta F$ | 1 | 1 or 0 |

In comparison with the prior art (i.e. non-FSK) system, for each one-clock bit, only one data bit is represented. In contrast, using a 2-bit FSK scheme, two data bits are represented during each clock bit, therefore the data through-put rate is doubled at the same clock speed (or even quadrupled if combined with double clocking). Note that the assignment of a state to a particular condition can be arbitrary (e.g., $F_0$ assigned the binary state of "11" and the frequency shift of +2 $\Delta F$) or can be systematic as shown in Table 1 above (e.g., $F_0$ assigned the binary state of "00" and the frequency shift of +1 $\Delta F$). While the above example shows the frequencies being asymmetrically shifted upward from base frequency $F_b$ (e.g., 30.000 MHz), the frequencies can also be centered on the base frequency $F_b$ and shifted symmetrically above and below the base frequency $F_b$ such as shown in Table 2:

TABLE 2

| Condition | State | Frequency Shift | #$\Delta F$ = 25 kHz |
|---|---|---|---|
| $F_0$ | 00 | 30.025 MHz | +1 $\Delta F$ |
| $F_1$ | 01 | 30.050 MHz | +2 $\Delta F$ |
| $F_2$ | 10 | 29.975 MHz | −1 $\Delta F$ |
| $F_3$ | 00 | 29.950 MHz | −2 $\Delta F$ |

Base frequency can also be one of the conditions. The conditions can be symmetrically or asymmetrically distributed around the base frequency $F_b$. A symmetrical distribution around the base frequency $F_b$ can be preferable since well-known RF mixing circuitry can produce symmetrical, sideband frequencies that can then be easily selected. The $\Delta F$ is not required to be a constant value. A constant $\Delta F$ can allow a simpler circuitry and operating parameters than a non-constant $\Delta F$. While 25 kHz value is used in the above example for $\Delta F$, lesser or smaller values can also be used. The magnitude of the $\Delta F$ is limited by the discriminating capabilities of the circuitry and process as the magnitude of the $\Delta F$ decreases and the accuracy and power characteristics of the resulting signals as the magnitude of the $\Delta F$ increases. Further, as will be discussed in more detail below the desired number of $\Delta Fs$ and the available bandwidth of the transmission medium (e.g., SCSI bus) will also limit the magnitude of the $\Delta F$.

Figure 2:
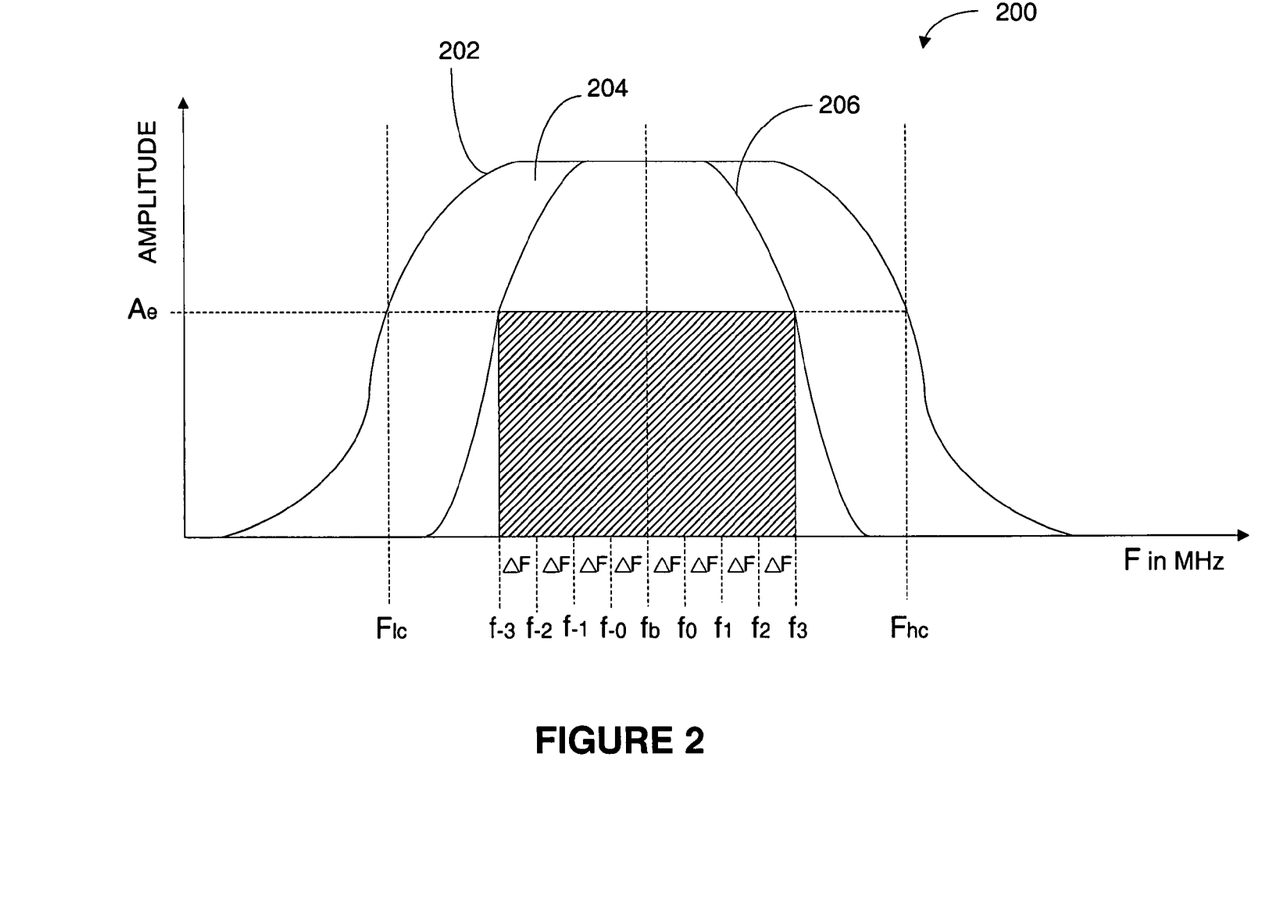
FIG. 2 is a diagram of the available bandwidth of a data transmission bus system according to one embodiment of the present invention.

FIG. 2 is a diagram of the available bandwidth 200 of a data transmission bus system according to one embodiment of the present invention. Amplitude is shown on the y-axis and frequency in MHz is shown on the x-axis. Curve 202 represents the complete bandwidth 204 of frequencies of the bus system. Many of the possible frequencies may not be ideal for one of more reasons. In one embodiment, each frequency used must have at least a desired cut-off or equalized amplitude $A_c$ (e.g., a 3 db of maximum amplitude). For example, curve 206 represents a band of frequencies that are between a low cut-off frequency $F_{lc}$ and a high cut-off frequency $F_{hc}$ and that also meet the equalization amplitude $A_c$. A base frequency $F_b$ is selected. The base frequency $F_b$ can be centered or offset from the center of the band of frequencies that are between low cut-off frequency $F_{lc}$ and a high cut-off frequency $F_{hc}$. Multiple $\Delta Fs$ are shown offset above (higher frequency) and below (lower frequency) around the base frequency $F_b$. While the multiple $\Delta Fs$ are shown symmetrically offset above and below the base frequency $F_b$ the multiple $\Delta Fs$ can also be asymmetrically offset.

In one embodiment, 30 MHz is selected as $F_b$ and each $\Delta F$ is equal to 25 kHz and the frequencies $F_0$, $F_1$, $F_2$, $F_3$ correspond to the frequencies described in Table 1 above. Similarly, frequencies $F_{-0}$, $F_{-1}$, $F_{-2}$, $F_{-3}$ correspond to 29.975, 29.950, 29.950, 29.925 MHz respectively. These are only exemplary values and magnitudes, other values and magnitudes could also be used without deviating from the present invention. The examples discussed above in Tables 1 and 2 describe methods of encoding two bits by using only four conditions. However, the eight conditions shown in FIG. 2 ($F_0$, $F_1$, $F_2$, $F_3$, $F_{-0}$, $F_{-1}$, $F_{-2}$, $F_{-3}$) allow the above examples to be extended to three bits, as three bits can represent as many as eight possible conditions. Three bits can triple the data transfer rate as compared to a non-FSK shifted data transfer.

Figure 3:
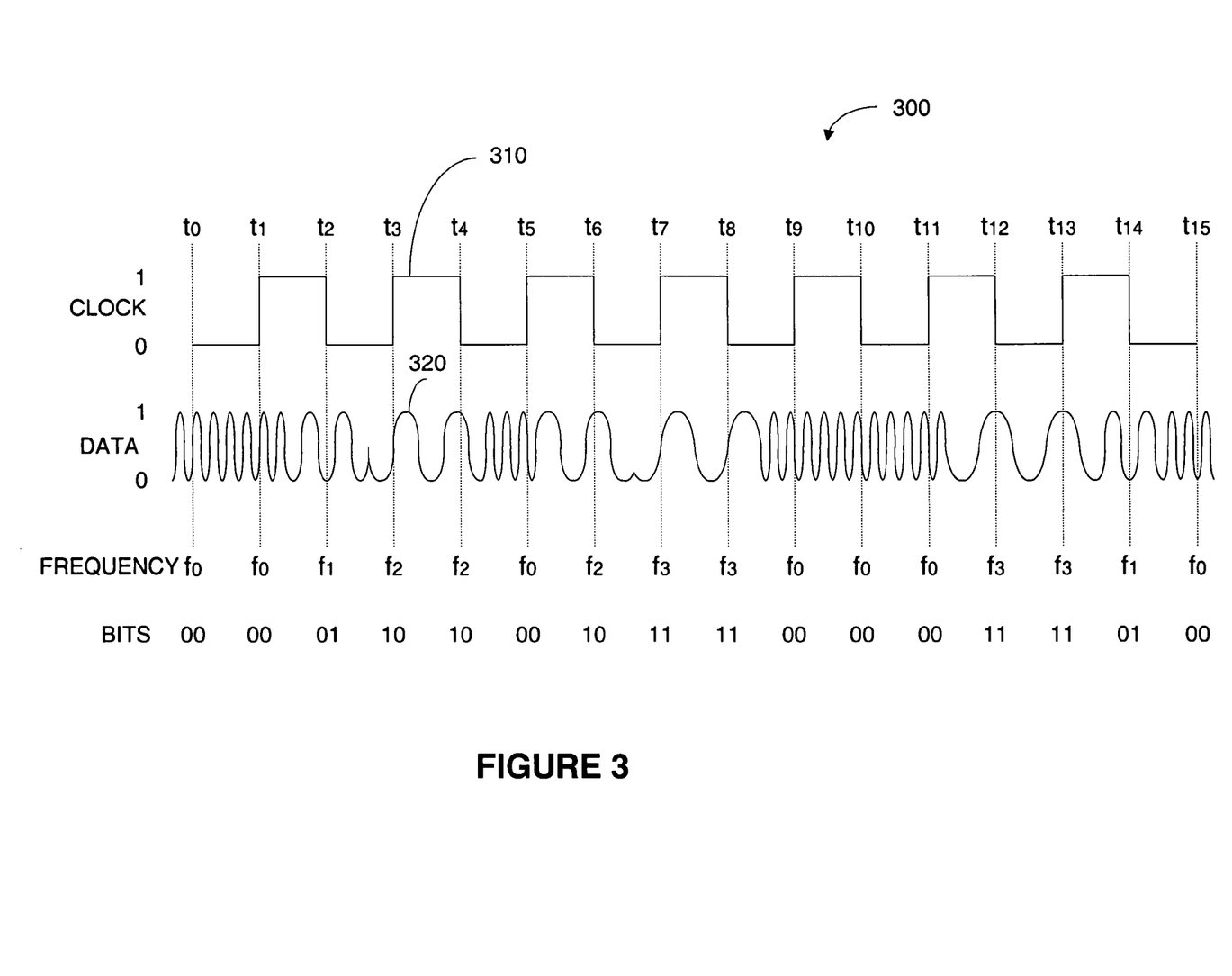
FIG. 3 shows a diagram illustrating a time progression in relation to data transmission in of a data transmission bus with two bit FSK multiplied data, in accordance with one embodiment of the present invention.

FIG. 3 shows a diagram 300 illustrating a time progression in relation to data transmission in of a data transmission bus with two bit FSK multiplied data, in accordance with one embodiment of the present invention. A clock signal 310 and a data signal 320 are shown. The data in the data signal 320 can be double clocked such that data is sent/received on each of the leading edge and trailing edges of the clock signal 310. Times $t_0$ to $t_{15}$ correspond to each of the respective leading edges and trailing edges of the clock signal 310.

By way of example, two bits can be encoded (i.e., modulated) into the data signal 320 at $t_0$, by shifting the frequency of the data signal 320 to a frequency $F_0$. $F_0$ corresponds to two bits of "00". Therefore, when the data shown at to is received and demodulated (i.e. decoded) two bits, "00", will be received rather than only one bit (e.g., 1 or 0). Similarly, at $t_7$, two bits "11" can be encoded into the data signal 320 by shifting the frequency to $F_3$. Therefore, when the data shown at $t_7$ is received and demodulated two bits, "11", will be received.

As shown in FIG. 3, two bits of data can be delivered at each of the leading and trailing edges of the clock signal because four (i.e. $2^2$) possible frequencies are used. Similarly, if eight (i.e. $2^3$) possible frequencies, (e.g., $F_0$, $F_1$, $F_2$, $F_3$, $F_{-0}$, $F_{-1}$, $F_{-2}$, $F_{-3}$) such as shown in FIG. 2 above, are used, then three bits can be encoded/decoded at each of the leading and trailing edges of the clock signal. If sixteen (i.e. $2^4$) different frequencies can be used, then the invention and be extended to encode/decode four bits at each of the leading and trailing edges of the clock signal. The invention can be extended to encode/decode n bits as long as $2^n$ separate frequencies can be successfully used. The number of frequencies that may be used is limited by the performance of the circuitry e.g., the stability of the signals and the ability of the circuitry to accurately discriminate between the different frequencies.

Figure 4:
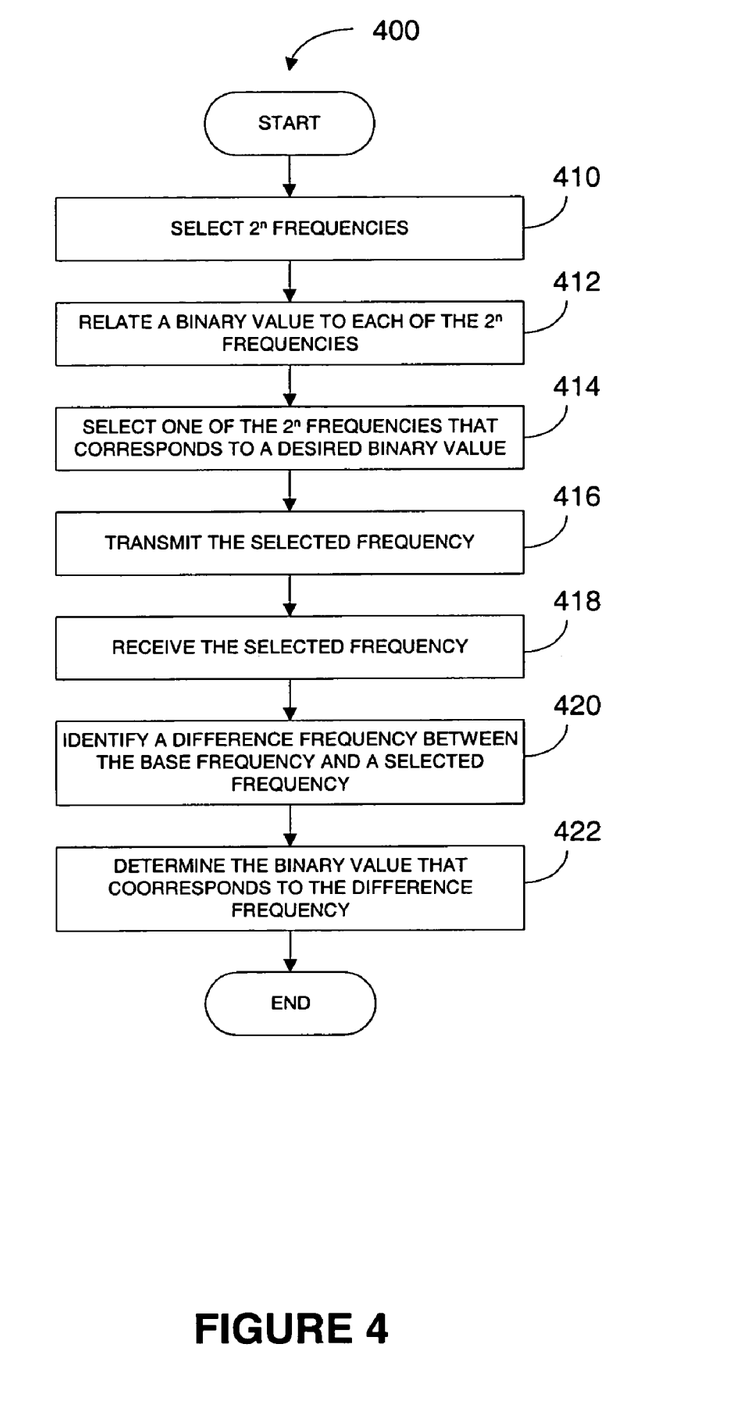
FIG. 4 shows the method operations for FSK modulating data into a data stream in accordance with one embodiment of the present invention.

FIG. 4 shows the method operations for FSK modulating data 400 into a data stream in accordance with one embodiment of the present invention. In operation 410, a set of $2^n$ frequencies are selected such as described in FIGS. 2 and 3 above, where n is equal to the number of bits to be modulated (e.g., encrypted) into the data stream in each sampling cycle. In operation 412, a binary value is assigned or related to each of the selected frequencies.

In operation 414, the base frequency is FSK modulated by shifting to a selected one of the $2^n$ frequencies. The selected frequency has an assigned binary value corresponds to the desired n bits to be encoded into the data stream. The selected frequency is transmitted in operation 416.

In operation 418 the modulated base frequency is received in a receiver. In operation 420 a difference frequency is determined. The difference frequency can equal the difference between the modulated base frequency and the base frequency. In operation 422 the binary value corresponding to the difference frequency is determined and output, and the method operations end.

Figure 5:
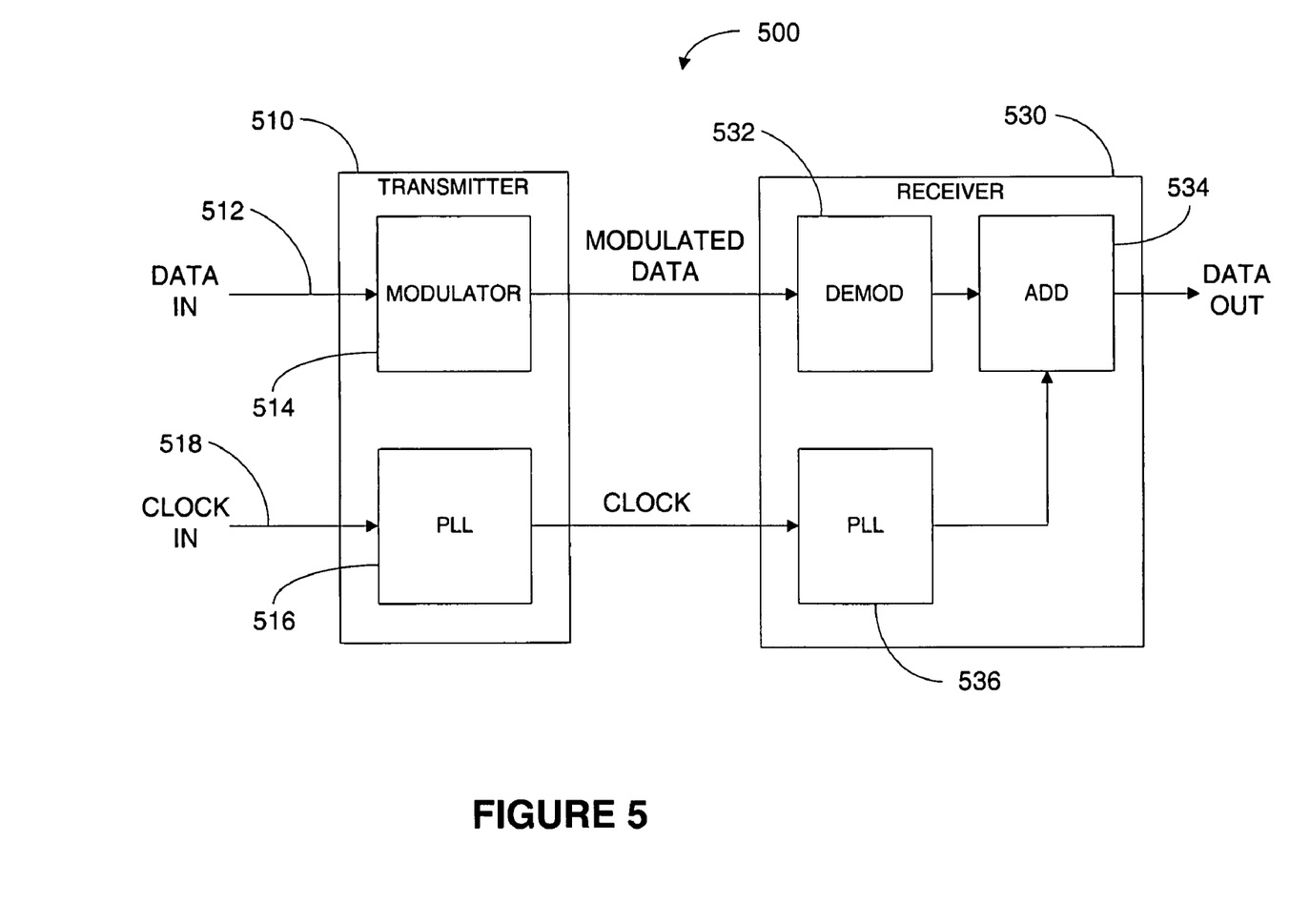
FIG. 5 is a block diagram of a circuit for FSK modulating data into a data stream in accordance with one embodiment of the present invention.

FIG. 5 is a block diagram of a circuit 500 for FSK modulating data into a data stream in accordance with one embodiment of the present invention. A transmitter 510 includes a modulator 514 for modulating the input data 512 onto a base frequency $F_b$. The modulator 514 FSK modulates a base frequency $F_b$ as described above. The FSK modulated base frequency is equal to one of the selected frequencies that represent a corresponding two or more bit binary value. The FSK modulated base frequency is transmitted via the bus 520 to a receiver 530. The transmitter also includes an input for the clock signal and a phase lock loop (PLL) circuit to stabilize the clock signal at a constant frequency. The PLL stabilized clock signal is both input to the modulator 514 and output as a clock reference signal to the receiver 530. The modulator 514 uses the clock reference signal to FSK modulate pulses during each clock cycle or of each half clock cycle when combined with double clocking each clock cycle. The clock signal can also be extracted by the PLL circuitry from the modulated data signals.

The receiver 530 includes a demodulator 532, a summing circuit 534, and a PLL circuit 536. The PLL circuit 536 stabilizes the clock reference signal at a constant frequency. The stabilized clock signal is input to the summing circuit 534 to time the sampling of the frequency shifted data signal so as to extract the data during the appropriate sampling cycle.

The transmitter 510 and the receiver 530 can be part of any device that must communicate via the bus 520. Typically, every device on the bus 520 will include both a receiver 530 and transmitter 510 so that the device can both receive and transmit data via the bus 520. By way of example, the transmitter 510 can be part of a SCSI interface/controller device and the receiver 530 can be in a hard drive, thereby enabling the SCSI interface/controller device to transmit FSK encoded data to the hard drive.

In an alternative embodiment, the data can be encoded onto a base reference signal as a function of phase rather than a function of frequency as described above. This can be referred to as phase shift keying (PSK) where several different phases of a single frequency are selected and each phase corresponds to a two or more bit binary value.

Figure 6A:
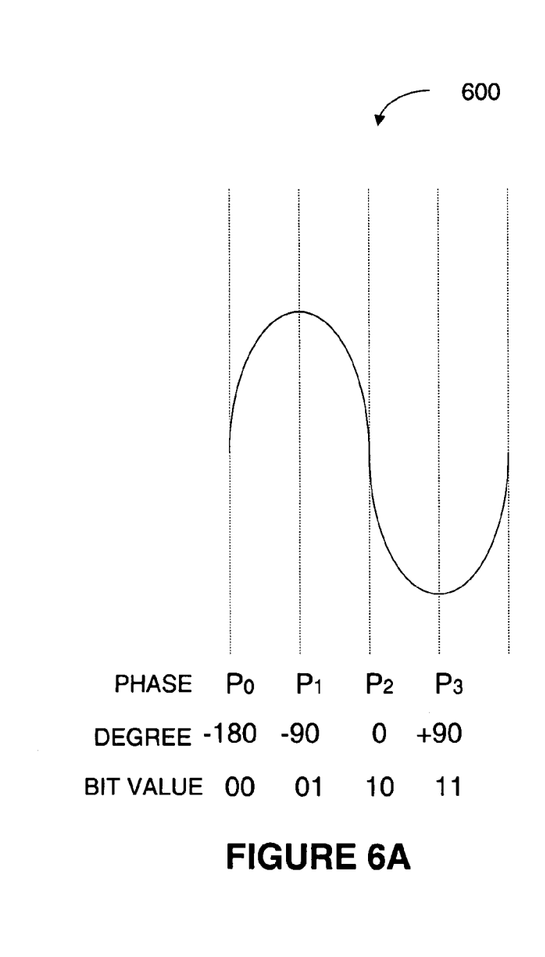
FIG. 6A shows multiple phases of a single cycle of a base frequency in accordance with one embodiment of the present invention.

FIG. 6A shows multiple phases of a single cycle 600 of a base frequency in accordance with one embodiment of the present invention. The single cycle of the base frequency is divided into four phases ($P_0$, $P_1$, $P_2$, $P_3$) as described in Table 3 below for a two bit system:

TABLE 3

| Condition | State | Phase Shift | #ΔP = 90 degrees |
|---|---|---|---|
| $P_0$ | 00 | −180 degrees | −2 ΔP |
| $P_1$ | 01 | −90 degrees | −1 ΔP |
| $P_2$ | 10 | 0 degrees | +1 ΔP |
| $P_3$ | 11 | +90 degrees | +2 ΔP |

Note that the assignment of a state to a particular condition can be arbitrary (e.g., $P_0$ assigned the binary state of "11" and the phase shift of +2 ΔP) or can be systematic as shown in Table 3 above (e.g., $P_0$ assigned the binary state of "00" and the phase shift of +1 ΔP). While the above example shows the phases $P_0$, $P_1$, $P_2$, $P_3$ being asymmetrically distributed around a selected base phase $P_2$, (0 degrees) it should be understood that the selected phases can be symmetrically or asymmetrically distributed around the base phase. In the above example the base phase is one of the conditions (i.e., the selected phases). Alternatively, the base phase can be a phase other than a phase that is also assigned to one of the conditions.

In one embodiment, the ΔP is not a constant value (e.g., 10, 20, 30, 45, or 90 degrees). A constant ΔP can allow a simpler circuitry and operating parameters than a non-constant ΔP. While a 90-degree value is used in the above example for ΔP, larger or smaller values can also be used. In one embodiment, ΔP is 30 degrees. The magnitude of the ΔP is limited by the discriminating capabilities of the circuitry and process as the magnitude of the ΔP decreases. The accuracy of the resulting phase shifted signals can increase as the magnitude of the ΔP increases however, ΔP cannot be greater than 360 degrees divided by $2^n$ where n is equal to the number of bits to be encoded.

Figure 6B:
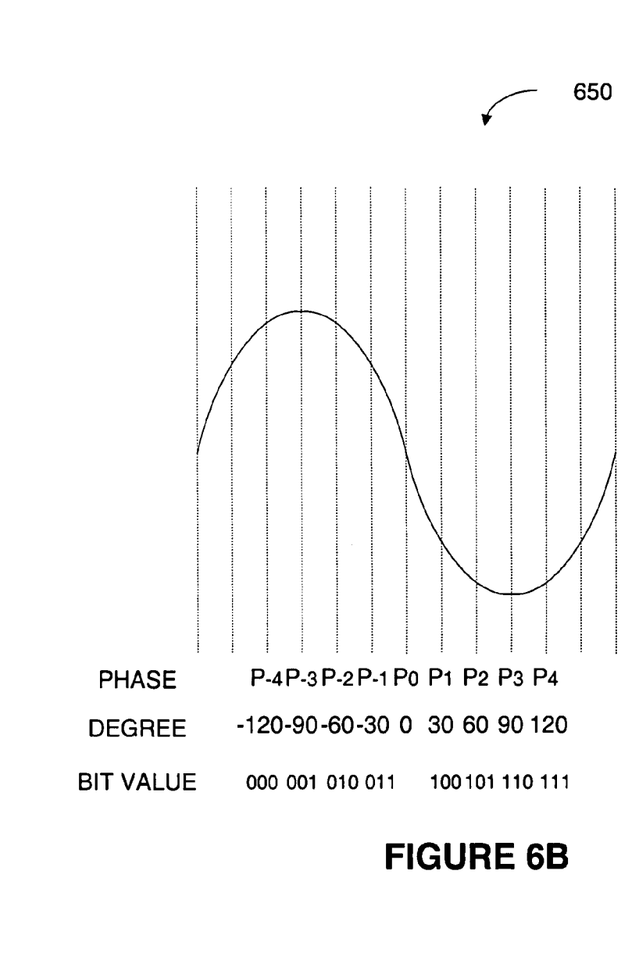
FIG. 6B shows multiple phases of a single cycle of a base frequency in accordance with one embodiment of the present invention.

FIG. 6B shows multiple phases of a single cycle 650 of a base frequency in accordance with one embodiment of the present invention. The single cycle of the base frequency is divided into eight phases ($P_0$, $P_1$, $P_2$, $P_3$, $P_4$, $P_5$, $P_6$, $P_7$) as described in Table 4 below for a three bit encoding system:

TABLE 4

| Condition | State | Phase Shift | #ΔP = 30 degrees |
|---|---|---|---|
| $P_0$ | 000 | −120 degrees | −4 ΔP |
| $P_1$ | 001 | −90 degrees | −3 ΔP |
| $P_2$ | 010 | −60 degrees | −2 ΔP |
| $P_3$ | 011 | −30 degrees | −1 ΔP |
| Base Phase | | 0 degrees | |

TABLE 4-continued

| Condition | State | Phase Shift | #ΔP = 30 degrees |
|---|---|---|---|
| $P_4$ | 100 | +30 degrees | +1 ΔP |
| $P_5$ | 101 | +60 degrees | +2 ΔP |
| $P_6$ | 110 | +90 degrees | +3 ΔP |
| $P_7$ | 111 | +120 degrees | +4 ΔP |

In one embodiment a single cycle of the base frequency can also be divided into sixteen ($2^4$) phases ($P_{-7}$, $P_{-6}$, $P_{-5}$, $P_{-4}$, $P_{-3}$, $P_{-2}$, $P_{-1}$, $P_{-0}$, $P_0$, $P_1$, $P_2$, $P_3$, $P_4$, $P_5$, $P_6$, $P_7$) as described in Table 5 below for a four bit encoding system:

TABLE 5

| Condition | State | Phase shift | #ΔP = 20 degrees |
|---|---|---|---|
| $P_{-7}$ | 0000 | −160 degrees | −8 ΔP |
| $P_{-6}$ | 0001 | −140 degrees | −7 ΔP |
| $P_{-5}$ | 0010 | −120 degrees | −6 ΔP |
| $P_{-4}$ | 0011 | −100 degrees | −5 ΔP |
| $P_{-3}$ | 0100 | −80 degrees | −4 ΔP |
| $P_{-2}$ | 0101 | −60 degrees | −3 ΔP |
| $P_{-1}$ | 0110 | −40 degrees | −2 ΔP |
| $P_{-0}$ | 0111 | −20 degrees | −1 ΔP |
| Base Phase | | 0 degrees | |
| $P_0$ | 1000 | +20 degrees | +1 ΔP |
| $P_2$ | 1001 | +40 degrees | +2 ΔP |
| $P_2$ | 1010 | +60 degrees | +3 ΔP |
| $P_3$ | 1011 | +80 degrees | +4 ΔP |
| $P_4$ | 1100 | +100 degrees | +5 ΔP |
| $P_5$ | 1101 | +120 degrees | +6 ΔP |
| $P_6$ | 1110 | +140 degrees | +7 ΔP |
| $P_7$ | 1111 | +160 degrees | +8 ΔP |

Similarly, thirty-two ($2^5$) different phases can be used for a five bit encoding system.

Figure 7:
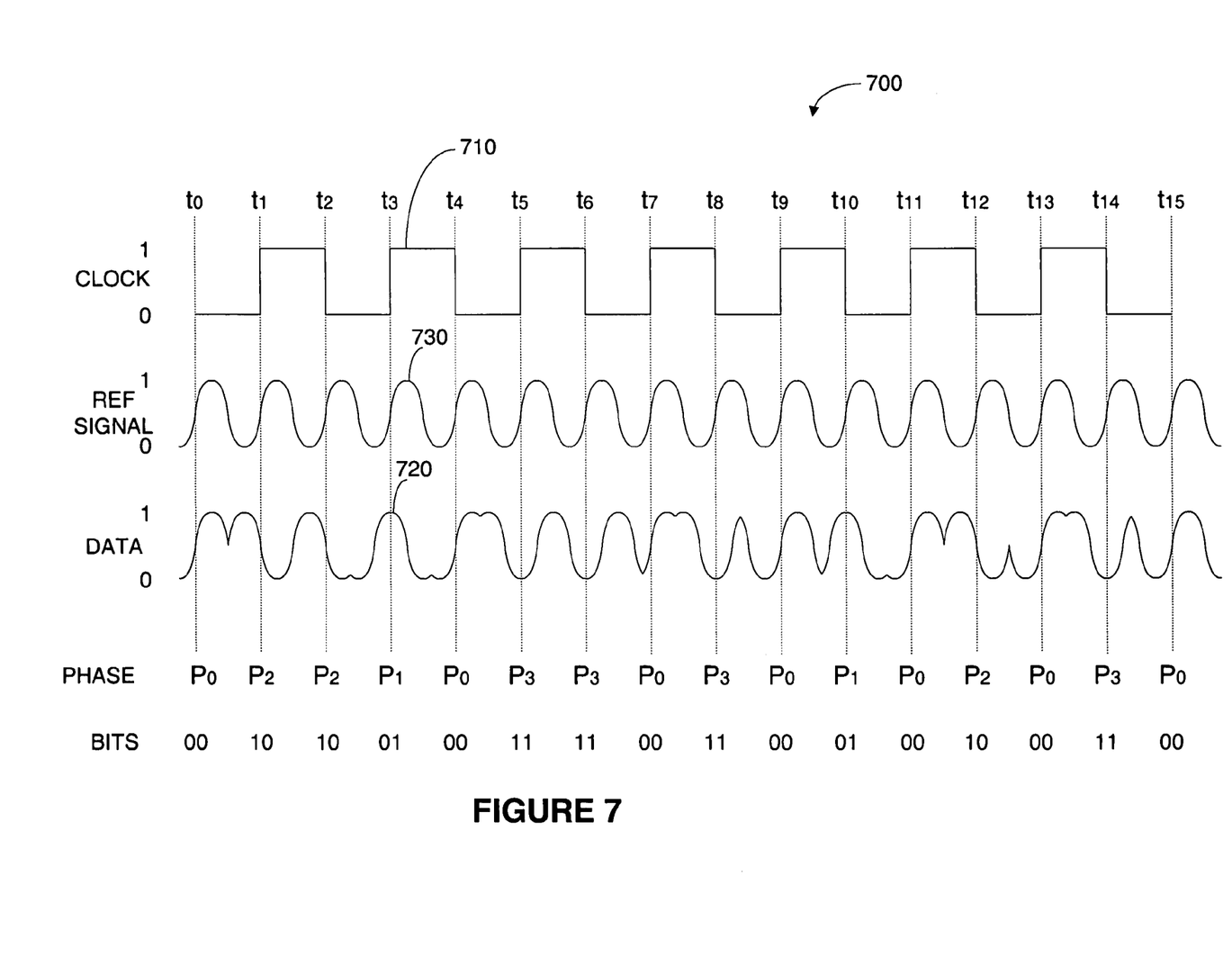
FIG. 7 shows a diagram 700 illustrating a time progression in relation to data transmission in of a data transmission bus with two bit PSK multiplied data, in accordance with one embodiment of the present invention.

FIG. 7 shows a diagram 700 illustrating a time progression in relation to data transmission in of a data transmission bus with two bit PSK multiplied data, in accordance with one embodiment of the present invention. A clock signal 710 and a data signal 720 are shown. A base reference signal 730 is also shown. The data in the data signal 720 can be double clocked such that data is sent/received on each of the leading edge and trailing edges of the clock signal 710. Times $t_0$ to $t_{15}$ correspond to each of the respective leading edges and trailing edges of the clock signal 710.

By way of example, two bits can be encoded (i.e., modulated) into the data signal 720 at $t_0$, by shifting the phase of the data signal 720 to a phase $P_0$. $P_0$ corresponds to two bits of "00" such as described in Table 3 above. Therefore, when the data shown at to is received and demodulated (i.e. decoded) two bits, "00", will be received rather than only one bit (e.g., 1 or 0). Similarly, at $t_8$, two bits "11" can be encoded into the data signal 720 by shifting the phase to $P_3$. Therefore, when the data shown at $t_8$ is received and demodulated two bits, "11", will be received.

As shown in FIG. 7, two bits of data can be delivered at each of the leading and trailing edges of the clock signal because four (i.e. $2^2$) possible phases are used. Similarly, if eight (i.e. $2^3$) possible phases, ($P_0$, $P_1$, $P_2$, $P_3$, $P_{-0}$, $P_{-1}$, $P_{-2}$, $P_{-3}$) such as shown in FIG. 6B above, are used, then three bits can be encoded/decoded at each of the leading and trailing edges of the clock signal. If sixteen (i.e. $2^4$) different phases are used, then the invention can be extended to encode/decode four bits at each of the leading and trailing edges of the clock signal. The invention can be extended to encode/decode n bits as long as $2^n$ separate phases can be successfully used. The number of phases that may be used is limited by the performance of the circuitry e.g., the stability of the signals and the ability of the circuitry to discriminate between the different phases.

The base reference signal 730 provides a reference signal that the data signal 720 can be compared to so that the precise phase shift at any given sampling cycle can be accurately determined.

Figure 8:
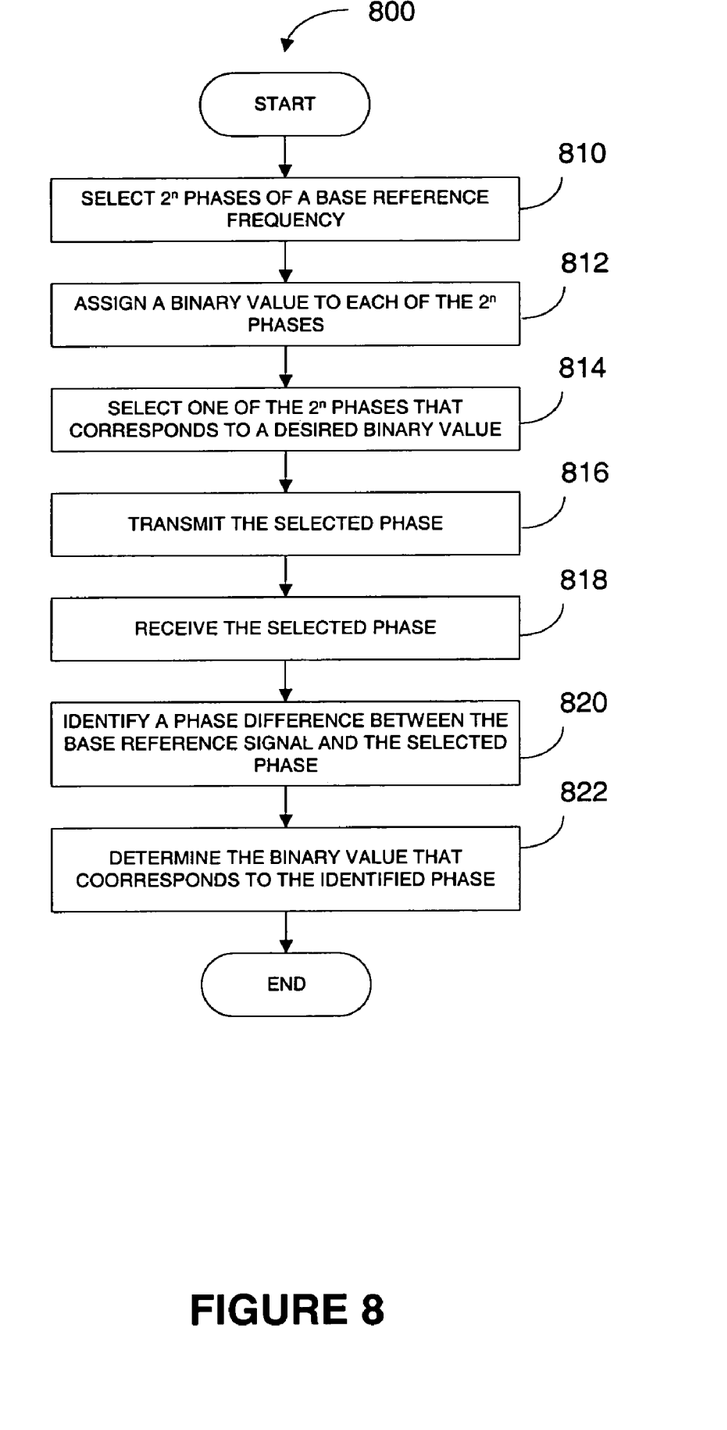
FIG. 8 shows the method operations for PSK modulating data into a data stream in accordance with one embodiment of the present invention.

FIG. 8 shows the method operations for PSK modulating data 800 into a data stream in accordance with one embodiment of the present invention. In operation 810, a set of $2^n$ phases are selected such as described in FIGS. 6A, 6B and 7 above, where n is equal to the number of bits to be modulated (e.g., encrypted) into the data stream in each sampling cycle. In operation 812, a binary value is assigned to each of the selected phases.

In operation 814, the base reference signal is PSK modulated by shifting the data signal 720 to a selected one of the $2^n$ phases. The selected phase has an assigned binary value that corresponds to the desired n bits to be encoded into the data stream. The selected phase is transmitted in operation 816.

In operation 818 the modulated base reference signal 730 is received in a receiver. In operation 820 a difference phase is determined. The difference phase can equal the phase difference between the PSK modulated data signal 720 and the base reference signal 730. In operation 822 the binary value corresponding to the difference phase is determined and output, and the method operations end.

Figure 9:
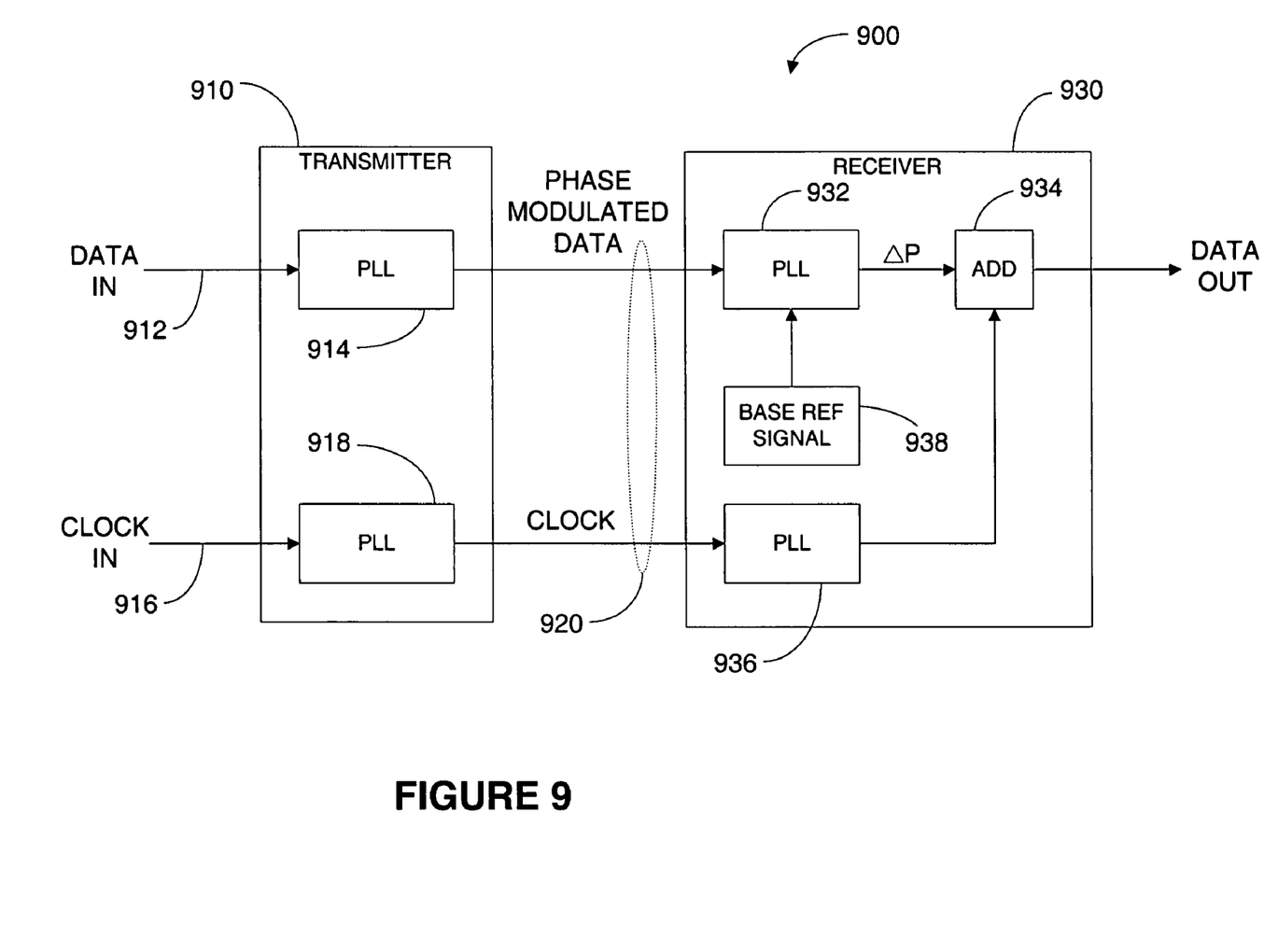
FIG. 9 is a block diagram of a circuit for PSK modulating data into a data signal in accordance with one embodiment of the present invention.

FIG. 9 is a block diagram of a circuit 900 for PSK modulating data into a data signal in accordance with one embodiment of the present invention. A transmitter 910 includes a first PLL circuit 914. The first PLL circuit 914 is used to modify the phase of a base reference signal according to the data signal applied to the data input 912 such as described above. During a given sampling cycle, the resulting PSK modulated data signal has a phase equal to one of the selected phases that represent a corresponding two or more bit binary value.

The PSK modulated data signal is transmitted via the bus 920 to a receiver 930. The transmitter 910 also includes an input 916 for the clock signal and a second PLL circuit 918 to stabilize the clock signal at a constant frequency and phase. The PLL stabilized clock signal is output as a clock signal to the receiver 930 via the bus 920.

The receiver 930 includes a third PLL circuit 932, a summing circuit 934, and a fourth PLL circuit 936. The fourth PLL circuit 936 stabilizes the clock signal at a constant frequency and phase. The stabilized clock signal is input to the summing circuit 934 to extract the data during each sampling cycle. The third PLL circuit 932 compares a base reference signal source 938 and the PSK modulated data signal to produce a phase error output signal equal to a multiple of ΔP.

The transmitter 910 and the receiver 930 can be part of any device that must communicate via the bus 920. Typically, every device on the bus 920 will include both a receiver 930 and transmitter 910 so that the device can both receive and transmit data via the bus 920. By way of example, the transmitter 910 can be part of a SCSI interface/controller device and the receiver 930 can be in a hard drive, thereby enabling the SCSI interface/controller device to transmit PSK encoded data to the hard drive.

In another embodiment, the above-described FSK and/or PSK methods and systems can also be used in combination to further increase the data transfer rate. In still another embodiment the above-described FSK and/or PSK methods and systems can also be combined with a method and system for further multiplying data transfer through the use of multilevel coding to transfer multiple bits per signal level thereby enabling the transmission of at least 4 bits every sampling cycle. Multilevel coding can encode multiple bits according to multiple voltage (i.e., amplitude) levels of the data signal. For more information on multilevel coding systems and methods, reference may be made to commonly owned U.S. patent application Ser. No. 10/215,069 filed on Aug. 7, 2002 and entitled "Method For Optimizing Data Transfer Rates Through Multilevel Coding,".

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general-purpose computer selectively activated or configured by a computer program stored in the computer. In particular, various general-purpose machines may be used with computer programs written in accordance with the teachings herein, or it may be more convenient to construct a more specialized apparatus to perform the required operations.

The invention can also be embodied as computer readable code on a computer readable medium. The computer readable medium is any data storage device that can store data, which can be thereafter, be read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer systems so that the computer readable code is stored and executed in a distributed fashion.

It will be further appreciated that the instructions represented by the operations in FIGS. 4 and 8 are not required to be performed in the order illustrated, and that all the processing represented by the operations may not be necessary to practice the invention. Further, the processes described in FIGS. 4 and 8 can also be implemented in software stored in any one of or combinations of the RAM, the ROM, or the hard disk drive.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A system for multiplying data throughput in a SCSI bus comprising:
   a transmitter including:
      an data input;
      a modulator;

a first phase locked loop (PLL) circuit, the first PLL for stabilizing a clock signal, the stabilized clock signal being coupled to the modulator;

logic for identifying a plurality of phases within a bandwidth of a SCSI bus;

logic for assigning a binary value to each one of the plurality of phases;

logic for selecting one of the plurality of phases wherein the assigned binary value of the selected phase corresponding to a plurality of bits to be transmitted during a first sampling cycle; and logic for transmitting the selected phase on the SCSI bus during the first sampling cycle;

a receiver, the receiver being coupled to the transmitter by a SCSI bus, the receiver including:

a demodulator;

an adding circuit having a first input coupled to an output of the demodulator;

a second PLL circuit having an input coupled to the stabilized clock signal from the first PLL circuit and having an output coupled to a second input to the adding circuit;

logic for receiving the selected phase in a receiver during the first sampling cycle;

logic for identifying the selected phase;

logic for determining the corresponding assigned binary value of the selected phase; and logic for outputting the corresponding assigned binary value of the selected phase.

2. The system of claim 1, wherein the SCSI bus includes a parallel SCSI bus.

3. The system of claim 1, wherein the SCSI bus includes a serial SCSI bus.

4. The system of claim 1, wherein the plurality of phases includes $2^n$ phases where n is equal to the number of bits in the binary value assigned to each of the plurality of phase.

5. The system of claim 1, wherein the plurality of phases are substantially centered about a base reference signal.

6. The system of claim 1, wherein the selected frequency is centered in the bandwidth of the SCSI bus.

7. The system of claim 1, wherein the plurality of phases are substantially equidistant.

8. The system of claim 7, wherein the plurality of substantially equidistant phases includes four substantially equidistant phases.

9. The system of claim 1, further comprising logic for applying multilevel data encoding.

10. The system of claim 1, wherein multiplying includes double edge clocking the data.

11. A system for multiplying data throughput in a SCSI bus comprising:

a transmitter including:

a data input; and a first phase locked loop (PLL) circuit for shifting the phase of a base reference signal according to an input signal applied to the data input;

a second PLL circuit for stabilizing a clock signal;

logic for identifying a plurality of phases within a bandwidth of a SCSI bus;

logic for assigning a binary value to each one of the plurality of phases;

logic for selecting one of the plurality of phases wherein the assigned binary value of the selected phase corresponding to a plurality of bits to be transmitted during a first sampling cycle; and logic for transmitting the selected phase on the SCSI bus during the first sampling cycle;

a receiver, the receiver being coupled to the transmitter by a SCSI bus, the receiver including:

a third PLL circuit, the third PLL circuit for comparing a base reference signal to the phase shifted data signal output from the transmitter, the third PLL circuit having an output;

an adding circuit having a first input coupled to an output of the third PLL circuit;

a fourth PLL circuit having an input coupled to the stabilized clock signal from the second PLL circuit and having an output coupled to a second input to the adding circuit;

logic for receiving the selected phase in a receiver during the first sampling cycle;

logic for identifying the selected phase;

logic for determining the corresponding assigned binary value of the selected phase; and logic for outputting the corresponding assigned binary value of the selected phase.

12. The system of claim 11, wherein the SCSI bus includes a parallel SCSI bus.

13. The system of claim 11, wherein the SCSI bus includes a serial SCSI bus.

* * * * *